United States Patent [19]
Hsiao et al.

[11] Patent Number: 5,981,402
[45] Date of Patent: Nov. 9, 1999

[54] METHOD OF FABRICATING SHALLOW TRENCH ISOLATION

[75] Inventors: Chih-Hsiang Hsiao, Taipei; Chin-Ching Hsu, Hsinchu, both of Taiwan

[73] Assignee: United Semiconductor Corp., Hsin-Chu, Taiwan

[21] Appl. No.: 09/040,912

[22] Filed: Mar. 18, 1998

[30] Foreign Application Priority Data

Dec. 31, 1997 [TW] Taiwan ................................. 86120045

[51] Int. Cl.$^6$ ................................ H01L 21/00; B44C 1/22
[52] U.S. Cl. .......................... 438/756; 216/39; 216/51; 216/99; 438/750
[58] Field of Search .................... 216/2, 39, 51, 216/99, 109; 438/700, 745, 749, 750, 753, 756, 221

[56] References Cited

U.S. PATENT DOCUMENTS

| | | | |
|---|---|---|---|
| 4,714,520 | 12/1987 | Gwozdz | 216/39 X |
| 5,328,559 | 7/1994 | Jerman | 216/99 X |
| 5,350,492 | 9/1994 | Hall et al. | 438/750 X |
| 5,767,017 | 6/1998 | Armacost et al. | 216/39 X |

*Primary Examiner*—William Powell
*Attorney, Agent, or Firm*—Knobbe, Martens Olson & Bear LLP

[57] ABSTRACT

A method of fabricating shallow trench isolation with multi-step HDP process for avoiding kinks is described. This method is to form two insulator layers with different etching rates, the etching rate of outer insulator layer being slower than that of inner insulator layer. Additionally, use of a multi-step HDP process produces better gapfilling and avoid clipping phenomenon in shallow trench isolations. This method comprises the following steps. A substrate having a mask layer thereabove is provided. A pattern is defined on the mask layer to form a trench. Then, a first insulator layer, which covers the inner wall of the trench and the top surface of the mask layer, is formed. Next, a second insulator layer is formed in the trench and over the first insulator layer, the etching rate of the first insulator layer being slower than that of the second insulator layer. The first and the second insulator layer are removed, using said mask layer as a etching stop layer. The mask layer is removed, leaving a salient plug of the first and the second insulator layer. Finally, the salient plug to first and second insulator layers is etched by isotropic etching to the level of the substrate.

16 Claims, 4 Drawing Sheets

METHOD OF FABRICATING SHALLOW TRENCH ISOLATION

CROSS-REFERENCE TO RELATED APPLICATION

This application claims the priority benefit of Taiwan application serial no. 86120045, filed Dec. 31, 1997, the full disclosure of which is incorporated herein by reference.

BACKGROUND OF THE INVENTION

1. Field of the Invention

This invention relates to a method of fabricating shallow trench isolation, and more particularly to a method of fabricating shallow trench isolation for high gapfilling and improving kink effect.

2. Description of Related Art

Shallow trench isolation is widely applied in fabricating semiconductor integrated circuits. Shallow trench isolation is formed in a substrate by forming a trench and filling the trench with insulation material. Such a trench can isolate devices in the substrate.

FIGS. 1A through 1D show the manufacturing progression of a shallow trench isolation according to the conventional method. Referring to FIG. 1A, a substrate 10 is provided. A silicon nitride layer 12 is formed over substrate 10. Then, a pattern is defined on silicon nitride layer 12 to form a trench 14.

Referring to FIG. 1B, an insulator layer 16, for example, a oxide layer, is deposited over a silicon nitrite layer 12 and fills the trench 14. Insulator layer 16 is deposited by for example, atmospheric chemical vapor deposition (APCVD), sub-atmospheric chemical vapor deposition (SACVD) or high density plasma chemical vapor deposition (HDP). Because the density of an insulator layer 16 formed by APCVD and SACVD is not dense enough, a high temperature annealing process is necessary to condense the insulator layer 16. After condensing, the density of an insulator layer 16 is not as dense as the density of an insulator layer formed by thermal oxidation. Similarly, the density of the insulator layer formed by HDP is not as dense as the density of an insulator layer formed by thermal oxidation.

Referring to FIG. 1C, an insulator layer 16 is partially removed by chemical mechanical polishing (CMP) using silicon layer 12 as a stop layer. Next, silicon nitride layer 12 is removed. A portion of the insulator layer 16 remains as a plug salient to the surface of the substrate 10.

Finally, referring to FIG. 1D, the plug of insulator layer 16 salient to the surface of the substrate 10 is etched by isotropic etching, for example, a 10:1 HF solution. Because isotropic etching etches the top and side of the salient plug of insulator layer 16 at the same rate, kinks 18 are formed at both sides of the shallow trench isolation. The kinks will reduce the character of the devices.

The kinks 18 at both sides of the shallow trench isolation must be generated by the conventional method, no matter what deposition method is used, for example, APCVD, ASCVD, or HDP. If the insulator layer 16 is formed by HDP, the faster the Ar flows, the better the gapfilling. But the high Ar flow will cause the clipping phenomenon. The clipping phenomenon causes devices fail. If low Ar flow is used to avoid the clipping phenomenon, the low gapfilling will occur and voids will form in shallow trench isolations.

SUMMARY OF THE INVENTION

It is therefore an object of the present invention to provide a method for fabricating shallow trench isolations to avoid kinks generated in the shallow trench isolation by multi-step HDP.

It is another object of the present invention to provide a method for fabricating shallow trench isolations by multi-step HDP to obtain a better gapfilling and to avoid the clipping phenomenon in shallow trench isolations.

To attain these objects and advantages, and in accordance with the purpose of the invention, as embodied and broadly described herein, the invention comprises a substrate having a mask layer thereabove is provided. A pattern is defined on the mask layer to form a trench. Then, a first insulator layer, which covers the inner wall of the trench and the top surface of the mask layer, is formed. Next, a second insulator layer is formed in the trench and over the first insulator layer, the etching rate of the first insulator layer being slower than that of the second insulator layer. The first and the second insulator layer are removed, using said mask layer as a etching stop layer. The mask layer is removed, leaving a salient plug of the first and the second insulator layer. Finally, the salient plug to first and second insulator layers is etched by isotropic etching to the level of the substrate.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
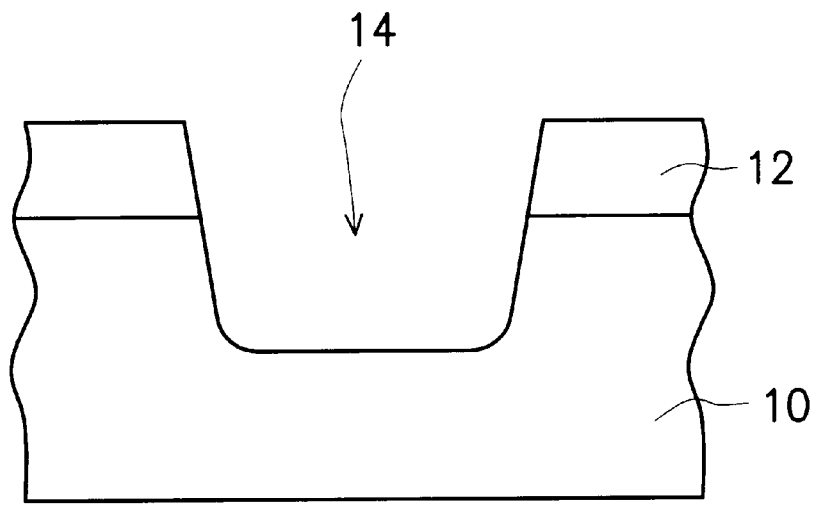
FIGS. 1A to 1D are cross-sectional views showing a conventional process steps of fabricating a shallow trench isolation.
Figure 1B:
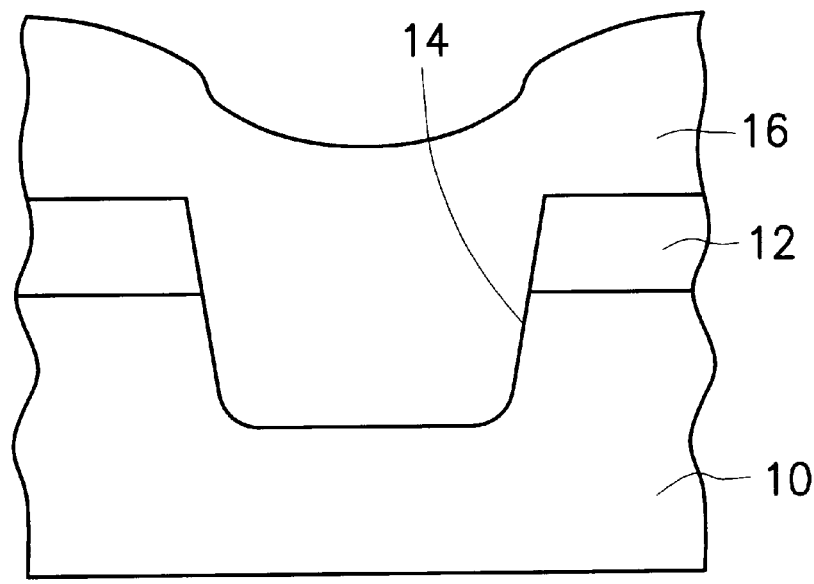
Figure 1C:
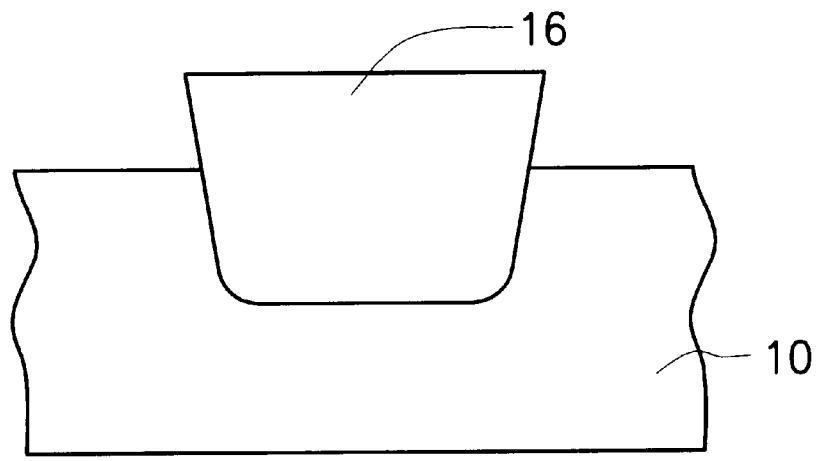
Figure 1D:
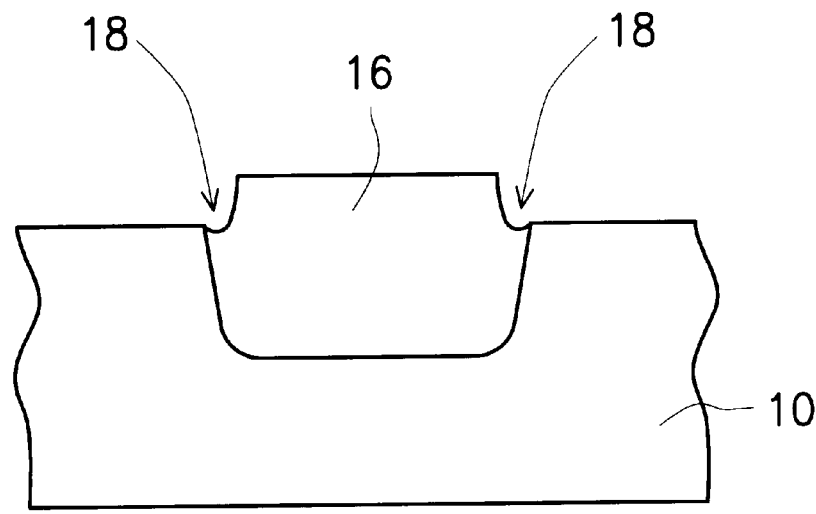
Figure 2A:
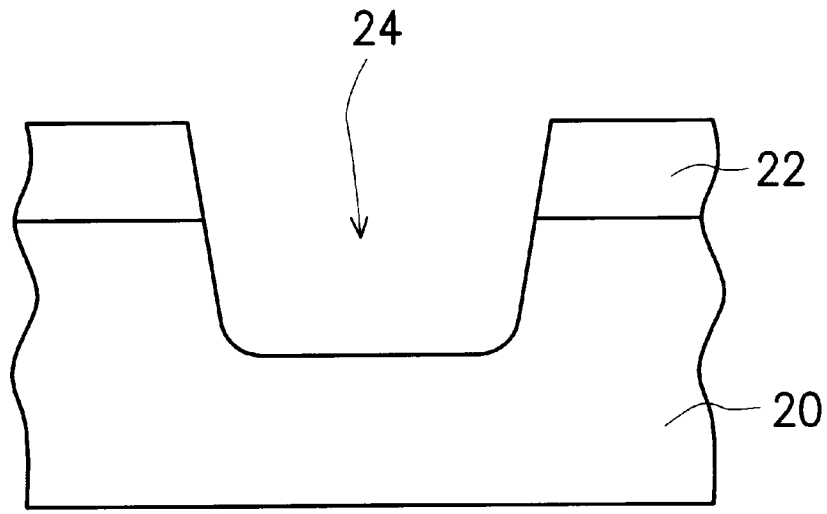
FIGS. 2A to 2E are cross-sectional views showing the process steps of fabricating shallow trench isolation according to one preferred embodiment of this invention.

FIGS. 2A through 2D show the manufacturing progression of shallow trench isolation according to one preferred embodiment of this invention. Referring to FIG. 2A, a substrate 20 is provided. A mask layer 22, for example, a silicon nitride layer, is formed over substrate 20. Then a pattern is defined on the mask layer 22 to form a trench 24.

Figure 2B:
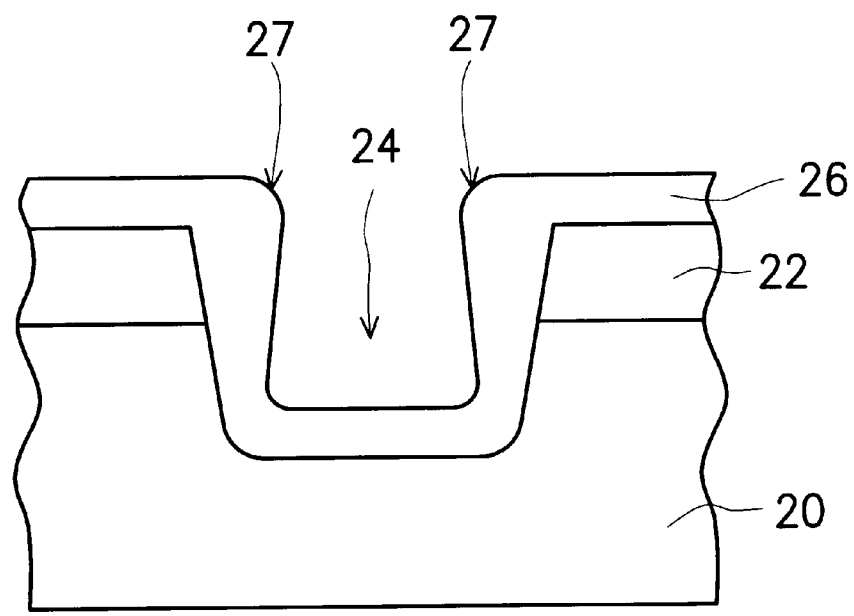

Next, referring to FIG. 2B, a high-density insulator layer 26, for example, a high-density silicon dioxide layer, is formed over the mask layer 22 and the trench 24 by HDP with low Ar flow and low RF bias power. At the same time, the insulator layer 26 generates an overhang 27 near the center of the trench 24. The etching rate of the insulator layer 26 by 10:1 HF solution is the same as that of an oxide layer formed by thermal oxidation and is about 300–350 Å/min.

Figure 2C:
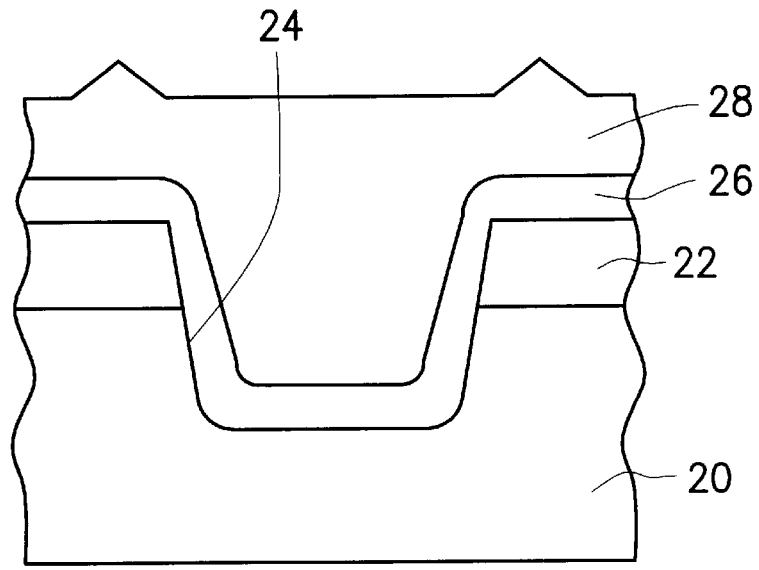

Referring to FIG. 2C, a low-density insulator layer 28, for example, a low-density silicon dioxide layer, is formed over the insulator layer 26 and fills in the trench 24 by HDP with high Ar flow and high RF bias power. The etching rate of the insulator layer 28 by 10:1 HF solution is about 430–470 Å/min. Using HDP with high Ar flow and high RF bias power will enhance the gapfilling ability of the insulator layer 28 and avoid the voids in the insulator layer 28. At the same time, the hangover 27 is removed by HDP with high Ar flow and high RF bias power.

Figure 2D:
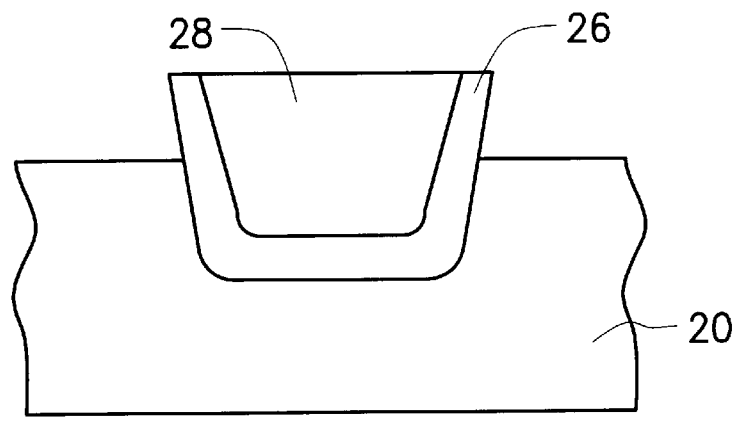

Referring to FIG. 2D, the insulator layer 26 and the insulator layer 28 are removed by CMP process using the mask layer 22 as an etching stop layer. Then, the mask layer 22 is removed, for example, by wet etching. A portion of the insulator layers 26 and 28 are higher than the surface of the substrate 20.

Figure 2E:
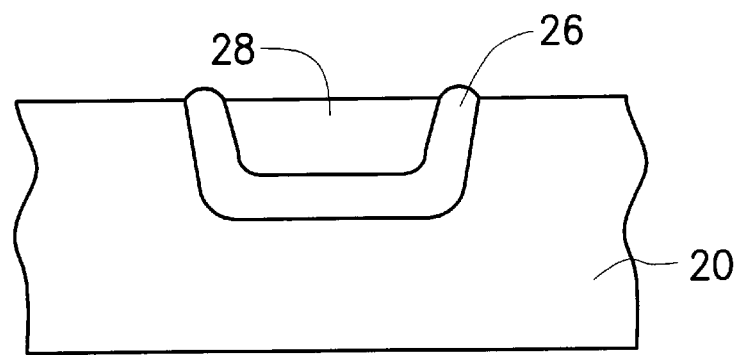

Finally, referring to FIG. 2E, the salient plug of insulators 26 and 28 are isotropically etched to the level of substrate 20, using, for example, a 10:1 HF solution. Because the etching rate of the insulator 26 is slower than that of the insulator layer 28, the erosion of the insulator layer 26 is less than the erosion of the insulator layer 28 during isotropic etching. Therefore, the kinks do not occurr.

The main point of forming shallow trench isolation according to this invention is to utilize the different etching rates of the insulator layers 26 and 28. The etching rate of the outer layer, insulator 26, is smaller than that of the inner layer, insulator layer 28. The inner and outer layers are removed to the same thickness during isotropic etching. Therefore, a plate surface will be obtained. There are no kinks on the surface of shallow trench isolation. Additionally, a insulator with excellent gapfilling is obtained in shallow trench isolation.

While the invention has been described by way of example and in terms of a preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating shallow trench isolation, comprising the steps of:
   providing a substrate having a mask layer thereabove;
   patterning said substrate and said mask layer to form a trench;
   performing a HDP process with low Ar flow and low RF bias power to form a first insulator layer which covers the inner wall of said trench and the top surface of said mask layer;
   performing a HDP process with high Ar flow and high RF bias power to form a second insulator layer in said trench and over said first insulator layer;
   removing said first and said second insulator layer, using said mask layer as an etching stop layer;
   removing said mask layer, so that a portion of said first and said second insulator layer remain as a salient plug; and
   etching said salient plug of first and second insulator layers.

2. A method according to claim 1, wherein said mask layer is a silicon nitride layer.

3. A method according to claim 1, wherein said first insulator layer is a high-density silicon dioxide layer.

4. A method according to claim 1, wherein said second insulator layer is a low-density silicon dioxide layer.

5. A method according to claim 1, wherein said first and said second insulator layers are removed by chemical mechanical polishing process.

6. A method according to claim 1, wherein the isotropic etching is by using 10:1 HF solution.

7. A method according to claim 6, wherein the etching rate of said first insulator layer is 300–350 Å/min by 10:1 HF solution.

8. A method according to claim 6, wherein the etching rate of said second insulator layer is 430–470 Å/min by 10:1 HF solution.

9. A method of fabricating shallow trench isolation, comprising the steps of:
   providing a substrate having a mask layer thereabove;
   patterning said substrate and said mask layer to form a trench;
   forming a first insulator layer which covers the inner wall of said trench and the top surface of said mask layer;
   forming a second insulator layer in said trench and over said first insulator layer, the etching rate of said first insulator layer being slower than that of said second insulator layer;
   removing said first and said second insulator layer, using said mask layer as a etching stop layer;
   removing said mask layer, then portion of said salient plug of first and said second insulator layer; and
   etching said salient plug of first and second insulator layers by isotropic etching.

10. A method according to claim 9, wherein said mask layer is a silicon nitride layer.

11. A method according to claim 9, wherein said first insulator layer is a high-density silicon dioxide layer which is formed by HDP with low Ar flow and low RF bias power.

12. A method according to claim 9, wherein said second insulator layer is a low-density silicon dioxide layer which is formed by HDP with high Ar flow and high RF bias power.

13. A method according to claim 9, wherein said first and said second insulator layers are removed by chemical mechanical polishing process.

14. A method according to claim 9, wherein the isotropic etching is by using 10:1 HF solution.

15. A method according to claim 14, wherein the etching rate by 10:1 HF solution of said first insulator layer is 300–350 Å/min.

16. A method according to claim 14, wherein the etching rate by 10:1 HF solution of said second insulator layer is 430–470 Å/min.

* * * * *